(12) United States Patent  (10) Patent No.: US 8,504,759 B2
Villa et al.  (45) Date of Patent: Aug. 6, 2013

(54) METHOD AND DEVICES FOR CONTROLLING POWER LOSS

(75) Inventors: Corrado Villa, Sovico (IT); Daniele Balluchi, Vimercate (IT); Graziano Mirichigni, Pietracamela (IT)

(73) Assignee: Micron Technology, Inc., Boise, ID (US)

( * ) Notice: Subject to any disclaimer, the term of this patent is extended or adjusted under 35 U.S.C. 154(b) by 508 days.

(21) Appl. No.: 12/472,153

(22) Filed: May 26, 2009

(65) Prior Publication Data

US 2010/0306446 A1 Dec. 2, 2010

(51) Int. Cl.
*G11C 13/00* (2006.01)

(52) U.S. Cl.
USPC ........................................................ 711/103

(58) Field of Classification Search
USPC ............................................................ 711/3
See application file for complete search history.

(56) References Cited

U.S. PATENT DOCUMENTS

| | | | |
|---|---|---|---|
| 2004/0128281 A1* | 7/2004 | Terazono et al. | 707/1 |
| 2004/0153902 A1* | 8/2004 | Machado et al. | 714/710 |
| 2004/0268046 A1* | 12/2004 | Spencer | 711/118 |
| 2006/0184719 A1* | 8/2006 | Sinclair | 711/103 |
| 2007/0011421 A1* | 1/2007 | Keller et al. | 711/165 |
| 2007/0287515 A1* | 12/2007 | Fagrenius et al. | 455/575.4 |

* cited by examiner

*Primary Examiner* — Hoai V Ho
*Assistant Examiner* — Min Huang
(74) *Attorney, Agent, or Firm* — Schwegman, Lundberg & Woessner, P.A.

(57) ABSTRACT

Described herein are methods and devices for controlling power loss. For one embodiment, a method includes issuing a controlled power off command with a controller. The method includes determining whether a memory device is performing a background operation. The method includes safely suspending the background operation or completing the background operation if the memory device is performing the background operation. The method includes safely removing a supply power.

15 Claims, 4 Drawing Sheets

METHOD AND DEVICES FOR CONTROLLING POWER LOSS

FIELD

Embodiments of the present invention relate generally to the field of controlling power loss in devices having non-volatile memory.

BACKGROUND

Computers, cellular phones, smart phones, personal digital assistants (PDAs), and other electronic devices may controllably lose power. For example, a battery power supply may slowly discharge to a level forcing a device to shut down. Non-volatile memory located in such devices may implement background operations, which are initiated and executed without awareness of a controller. An example of a background operation is a memory array refresh during which content of the memory array is periodically rewritten to recover from cell level drift due to voltage or temperature stress. Another example is the implementation of an embedded wear-leveling algorithm.

A prior approach for a power loss in an electronic device results in a power supply removal that interrupts and compromises the completion of the background task. Upon a subsequent restoration of power, the interruption of the background operation may result in data integrity issues or reliability issues.

BRIEF DESCRIPTION OF THE DRAWINGS

One or more embodiments of the present invention are illustrated by way of example and not limitation in the figures of the accompanying drawings, in which like references indicate similar elements and in which.

DETAILED DESCRIPTION

Described herein are methods and devices for controlling power loss. For one embodiment, a method includes issuing a controlled power off command with a controller. The method includes determining whether a memory device is performing a background operation. The method includes safely suspending the background operation or completing the background operation if the memory device is performing the background operation. The method includes safely removing a supply power.

The suspended background operation can be resumed upon a subsequent restoration of supply power. A background operation may include a memory array refresh or a wear-leveling algorithm. The safe completion or resumption of a suspended background operation results in enhanced memory reliability and data integrity in comparison to prior approaches.

Figure 1:
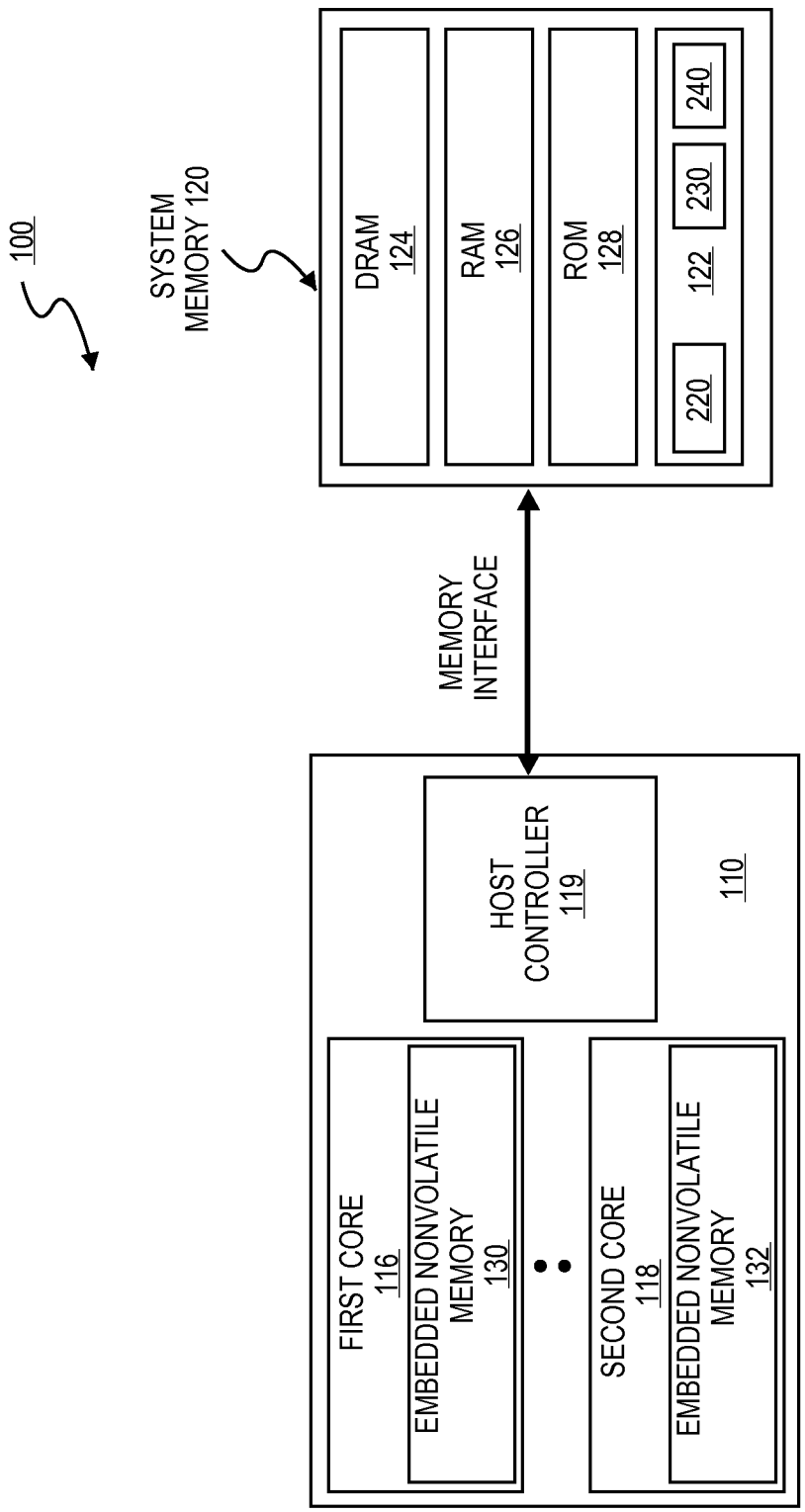
FIG. 1 illustrates a data processing device having a controllable power loss capability in accordance with one embodiment.

FIG. 1 illustrates a data processing device having a controllable power loss capability in accordance with one embodiment. The data processing device 100 includes a processing unit 110 having first and second processor cores 116 and 118, a host controller 119, and a system memory 120 coupled to the processing unit 110. The host controller 119 can be internal to the processing unit 110 or external to the processing unit 110. The first and second processing cores 116 and 118 include embedded non-volatile memory 130 and 132, respectively. The system memory 120 includes a non-volatile memory (NVM) device 122 and various types of memory (e.g., DRAM 124, RAM 126, ROM 128). The NVM device 122 implements a background operation and includes a non-volatile memory array 220 to store data. The NVM device 122 also includes a status register unit 230 having one or more registers and a command interface 240. The NVM device 122 will be discussed in more detail in conjunction with FIG. 2.

Figure 2:
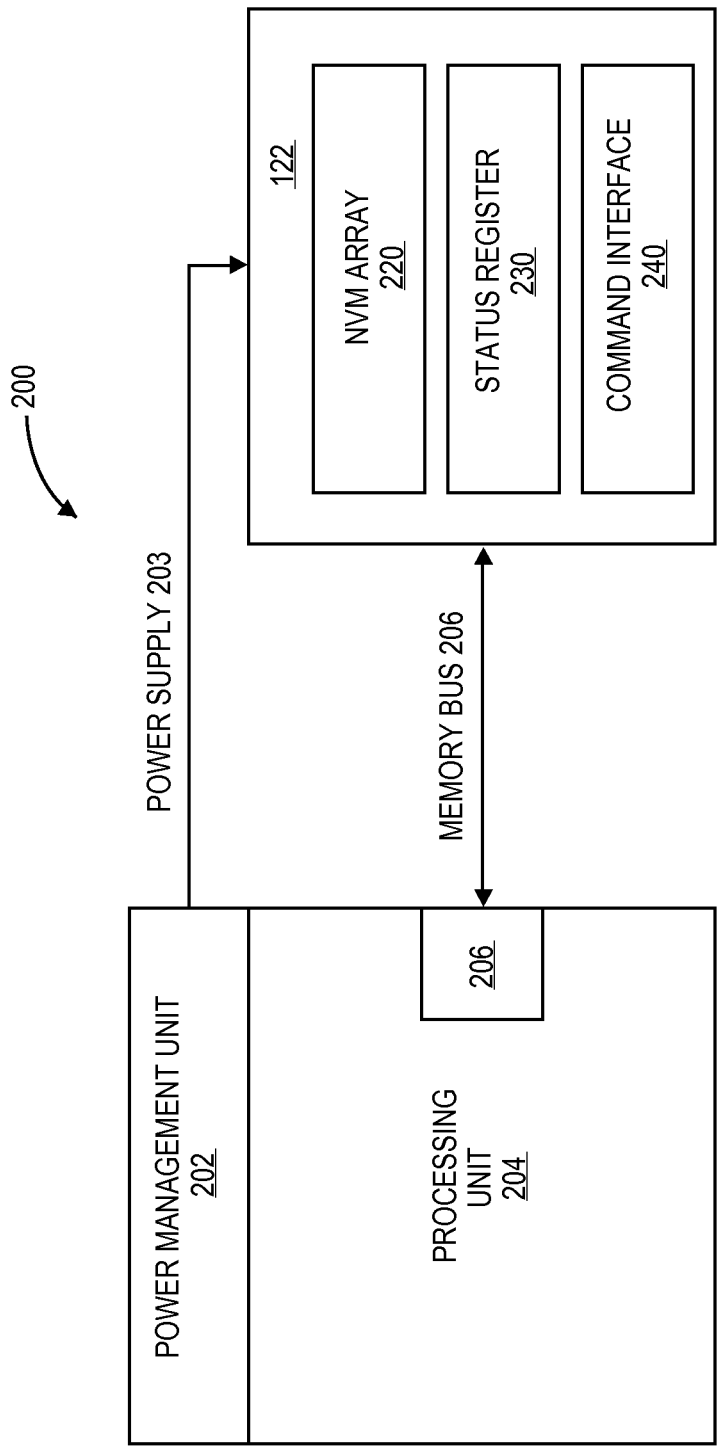
FIG. 2 illustrates a non-volatile memory (NVM) device coupled to a power management unit in accordance with one embodiment.

FIG. 2 illustrates the NVM device 122 coupled to a power management unit 202 in accordance with one embodiment. The NVM device 122 implements a background operation (e.g., memory array refresh, embedded wear-leveling algorithm) and includes a non-volatile memory (NVM) array 220 (e.g., based on NAND flash technology, NOR flash technology, PCM technology) to store data. The NVM device 122 also includes a status register unit 230 having one or more registers and a command interface 240. The command interface 240 is coupled to the NVM array 220 and receives a controlled power off command from a controller 206 coupled to or located within a processing unit 204. The controller 206 is coupled to the NVM device 122 via a memory bus 208. The command interface may be implemented as a finite state machines and can include mode registers (e.g., status register unit 230) or registers in an overlay window, which is associated with a set of registers mapped in the NVM array 220. The status register unit 230, which is coupled to the NVM array 220, stores information indicating whether the NVM device 122 is implementing the background operation. The NVM device 122 safely suspends the background operation or completes the background operation prior to loss of a supply power if the NVM device 122 is implementing the background operation when the controlled power off command is received from the controller 206.

In one embodiment, the background operation is safely completed or suspended automatically prior to the loss of the supply power. The NVM device 122 is configured to complete the suspended background operation after power is restored.

For an embodiment, a status register provides a memory acknowledgement in response to the controlled power off command to the controller 206. The power management unit 202 can proceed to remove power from the NVM device 122 after the controller 206 receives the memory acknowledgement. Alternatively, if the controller 206 does not receive the memory acknowledgement within a certain time period, it can proceed to have the power management unit 202 remove power from the NVM device 122. The certain time period allows the NVM device 122 sufficient time to suspend or complete the background operation. The status register unit 230 stores information indicating whether the NVM device 122 has safely suspended or completed the background operation. The status register unit 230 also stores information used by the NVM device 122 in resuming the suspended background operation upon restoration of the supply power. For some embodiments, the NVM device 122 implements the background task without the controller 206 having an awareness of the background operation until reading the status register unit 230 of the NVM device 122. For one embodiment, the NVM device is an integrated circuit device.

Figure 3:
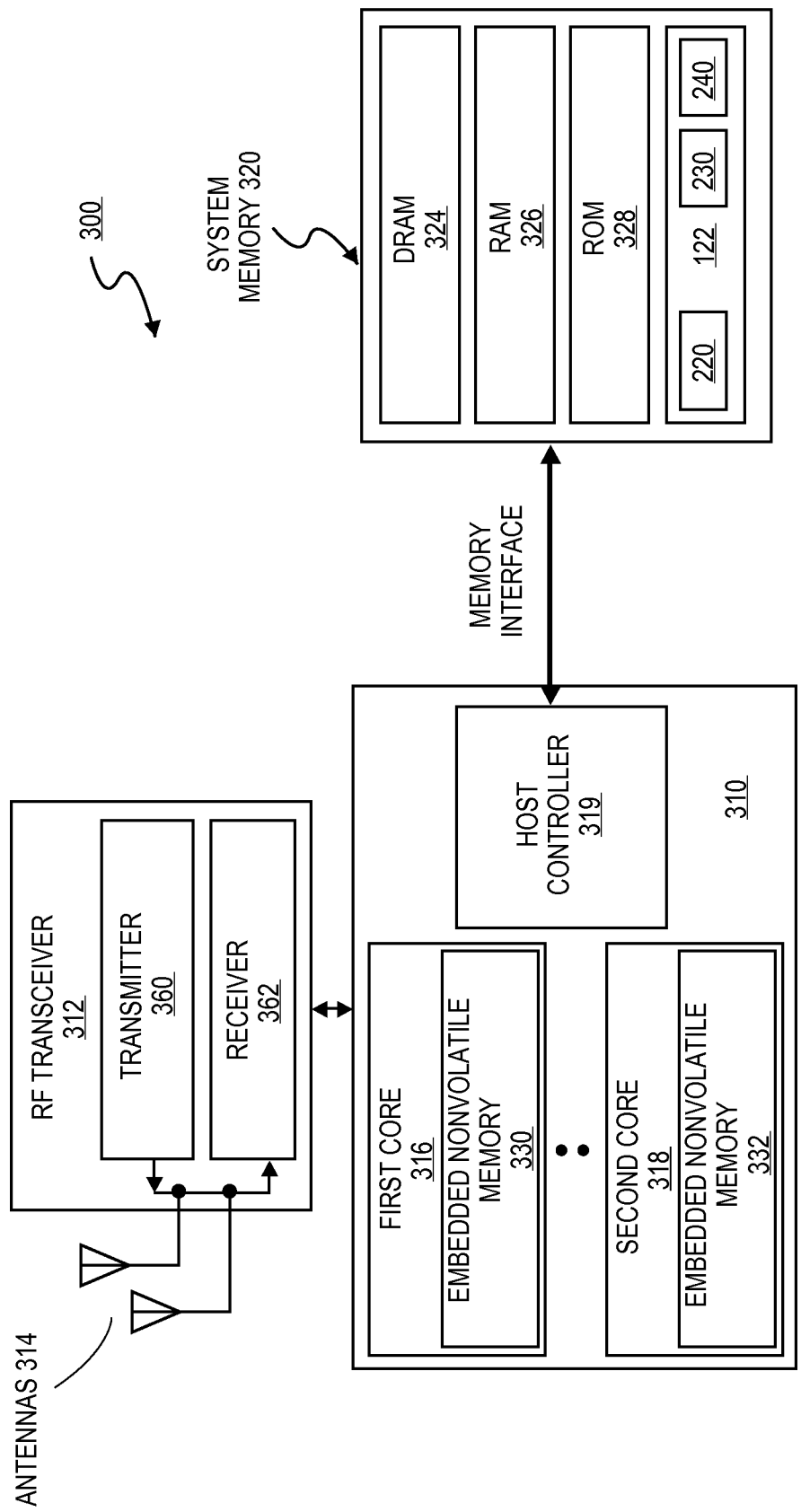
FIG. 3 illustrates a wireless communication device having a controllable power loss capability in accordance with one embodiment.

FIG. 3 illustrates a wireless communication device having a controllable power loss capability in accordance with one embodiment. The wireless communication device 300 is similar to the data processing device 100, except the wireless communication device 300 also includes a transceiver 312 coupled to the processing unit 310. The transceiver 312 receives over-the-air signals with antennas 314 and includes a transmitter 360 and a receiver 362. As shown in this wireless embodiment, communication device 300 includes one or more antenna structures 314 to allow radios to communicate with other over-the-air communication devices. As such, communication device 300 may operate as a cellular device or a device that operates in wireless networks. The radio subsystems collocated in the same platform of communications device 300 provide the capability of communicating with different frequency bands in an RF/location space with other devices in a network. It should be understood that the scope of the present invention is not limited by the types of, the number of, or the frequency of the communication protocols that may be used by communication device 300.

The embodiment illustrates the coupling of antenna structure 314 to a transceiver 312 to accommodate modulation/demodulation. In general, analog front end transceiver 312 may be a stand-alone Radio Frequency (RF) discrete or integrated analog circuit, or transceiver 312 may be embedded with a processor having one or more processor cores 316 and 318. The multiple cores allow processing workloads to be shared across the cores and handle baseband functions and application functions. An interface may be used to provide communication or information between the processor and the memory storage in a system memory 320. Although the scope of the present invention is not limited in this respect, the interface may comprise serial and/or parallel buses to share information along with control signal lines to be used to provide handshaking between the processor and system memory 320.

The system memory 320 may optionally be used to store instructions that are executed by the processor during the operation of wireless communication device 300, and may be used to store user data such as the conditions for when a message is to be transmitted by wireless communication device 300 or the actual data to be transmitted. For example, the instructions stored in system memory 320 may be used to perform wireless communications, provide security functionality for communication device 300, user functionality such as calendaring, email, internet browsing, etc.

System memory 320 may be provided by one or more different types of memory and may include optional DRAM, RAM, and/or ROM and the NVM device 122 having NVM array 220. The NVM array 220 may include a phase change material. NVM array 220 may be referred to as a Phase Change Memory (PCM), Phase-Change Random Access Memory (PRAM or PCRAM), Ovonic Unified Memory (OUM) or Chalcogenide Random Access Memory (C-RAM). NVM array 220 may include flash memory (e.g., NOR, NAND).

The NVM device 122 also includes a status register unit 230 having one or more registers and a command interface 240. The NVM device 122 is discussed above in more detail in conjunction with FIG. 2.

The volatile and nonvolatile memories may be combined in a stacking process to reduce the footprint on a board, packaged separately, or placed in a multi-chip package with the memory component placed on top of the processor. The embodiment also illustrates that one or more of the processor cores may be embedded with nonvolatile memory 330 and 332.

Figure 4:
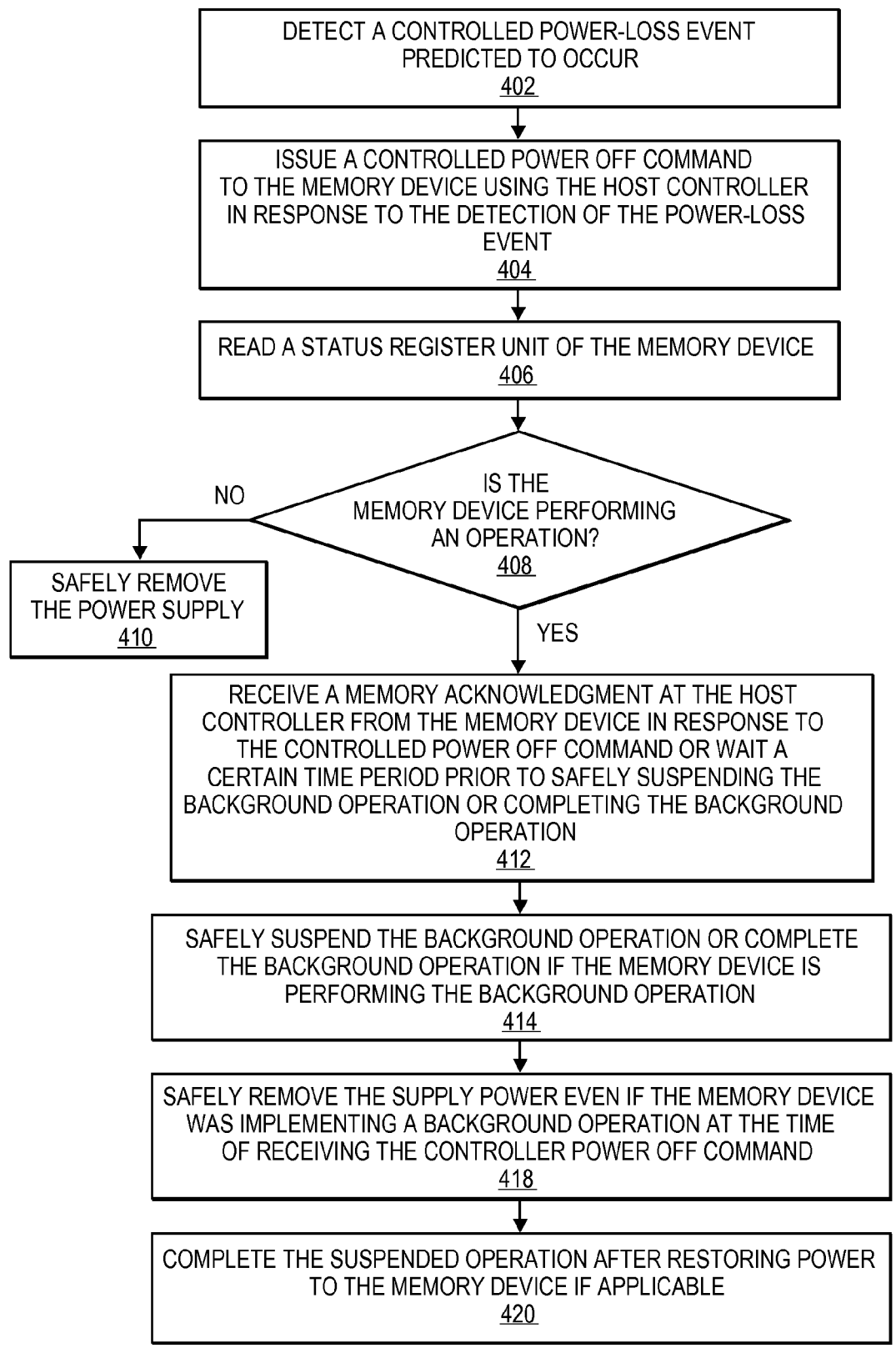
FIG. 4 illustrates a method for executing a controlled power off sequence in accordance with one embodiment.

FIG. 4 illustrates a method for executing a controlled power off sequence in accordance with one embodiment. The method includes detecting a controlled power loss event predicted to occur at block 402 For example, a host controller that is coupled to a memory device (e.g., NVM device) may detect that a battery power supply is approaching a complete discharge state, thus, requiring the device to shut down. The method includes issuing a controlled power off command to the memory device using the host controller in response to the detection of the power loss event at block 404. The method includes reading a status register unit of the memory device at block 406. The method includes determining whether a memory device is performing an operation at block 408. If the memory device is not performing an operation, then the power supply is safely removed at block 410.

If the memory device is performing an operation, then the status register unit can be accessed to determine when the operation has been completed or suspended. The method includes receiving a memory acknowledgement at the host controller from the memory device in response to the controlled power off command or waiting a certain time period prior to safely suspending the background operation or completing the background operation at block 412. The method includes safely suspending the background operation or completing the background operation if the memory device is performing the background operation at block 414. The method includes safely removing the supply power at block 416 even if the memory device was implementing a background operation at the time of receiving the controlled power off command. The method includes subsequently restoring power to the memory device at block 418. The method includes completing the suspended background operation after restoring power to the memory device if applicable at block 420.

Some portions of the detailed description are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EE-PROMs), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A non-volatile memory (NVM) device, comprising:
a NVM array to store data;
a command interface coupled to the NVM array, the command interface to receive a controlled power off command from a controller; and
a status register unit coupled to the NVM array, the status register unit to store information indicating whether the NVM device is implementing a background operation, the information to be read by the controller after the controlled power off command is received, and the NVM device to safely suspend the background operation in response to the controlled power off command prior to loss of supply power when the NVM device is determined to be implementing the background operation, wherein the NVM device is configured to complete the suspended background operation after the supply power is restored.

2. The integrated circuit device of claim 1, wherein the background operation is safely suspended automatically prior to the loss of the supply power.

3. A non-volatile memory (NVM) device, comprising:
a NVM array to store data;
a command interface coupled to the NVM array, the command interface to receive a controlled power off command from a controller; and
a status register unit coupled to the NVM array, the status register unit to store information indicating whether the NVM device is implementing a background operation, and the NVM device to safely suspend the background operation in response to the controlled power off command prior to loss of supply power when the NVM device is determined to be implementing the background operation, wherein the NVM device is configured to complete the suspended background operation after the supply power is restored, wherein the command interface is configured to send a memory acknowledgement to the controller in response to the controlled power off command through a status register.

4. The integrated circuit device of claim 1, wherein the background operation further comprises a memory array refresh or a wear-leveling algorithm.

5. The integrated circuit device of claim 1, wherein the status register unit is configured to store information indicating whether the NVM device has safely suspended or completed the background operation.

6. The integrated circuit device of claim 1, wherein the status register unit is configured to store information used by the NVM device in resuming the suspended background operation upon restoration of the supply power.

7. A data processing device, comprising:
a processing unit having one or more processor cores; and
system memory coupled to the processing unit, the system memory having a non-volatile memory (NVM) device comprising:
a NVM array to store data;
a command interface coupled to the NVM array, the command interface to receive a controlled power off command from the processing unit; and
a status register unit coupled to the NVM array, the status register unit to store information indicating whether the NVM device is implementing a background operation, the information to be read by the processing unit after the controlled power off command is received, the NVM device to safely suspend the background operation in response to the controlled power off command prior to loss of supply power when the NVM device is determined to be implementing the background operation, wherein the NVM device is configured to complete the suspended background operation after the supply power is restored.

8. The data processing device of claim 7, further comprising:
a power management unit, coupled to the processing unit, to remove the supply power from the NVM device after the background operation is safely suspended.

9. A data processing device, comprising:
a processing unit having one or more processor cores; and
system memory coupled to the processing unit, the system memory having anon-volatile memory (NVM) device comprising;
a NVM array to store data;
a command interface coupled to the NVM array, the command interface to receive a controlled power off command from the processing unit; and
a status register unit coupled to the NVM array, the status register unit to store information indicating whether the NVM device is implementing a background operation the NVM device to safely suspend the background operation in response to the controlled power off command and prior to loss of supply power when the NVM device is determined to be implementing the background operation, wherein the NVM device is configured to complete the suspended background operation after the supply power is restored, wherein the command interface is configured to send a memory acknowledgement through a status register to the processing unit in response to the controlled power off command.

10. The data processing device of claim 7, wherein the data processing device is a wireless communication device further comprising:
a transceiver coupled to the processing unit, the transceiver to receive over-the-air signals.

11. A method, comprising:
issuing a controlled power off command to a memory device using a controller;
reading a status register unit of the memory device;
determining whether the memory device is performing a background operation based on reading the status register unit of the memory device, the status register unit to store information safely suspending the background operation in response to the controlled power off command when the memory device is determined to be performing the background operation;
safely removing supply power;
subsequently restoring the supply power to the memory device; and
completing the suspended background operation after restoring the supply power to the memory device.

12. The method of claim 11, further comprising:
detecting a predicted controlled power loss event issuing a controlled power off command in response to the detection.

13. The method of claim 11, further comprising:
receiving a memory acknowledgement at the controller from the memory device in response to the controlled power of command or waiting a certain time period prior to safely suspending the background operation or completing the background operation.

14. The method of claim 11, wherein if the memory device is not performing the background operation then the supply power is safely removed.

15. The method of claim 11, wherein the memory device is configured to implement the background task without the host controller having an awareness of the background operation until reading the status register unit of the memory device.

* * * * *

UNITED STATES PATENT AND TRADEMARK OFFICE
CERTIFICATE OF CORRECTION

PATENT NO. : 8,504,759 B2  Page 1 of 1
APPLICATION NO. : 12/472153
DATED : August 6, 2013
INVENTOR(S) : Corrado Villa et al.

It is certified that error appears in the above-identified patent and that said Letters Patent is hereby corrected as shown below:

In the Claims:

In column 6, line 26, in Claim 7, delete "anon-volatile" and insert -- a non-volatile --, therefor.

In column 6, line 52, in Claim 9, delete "anon-volatile" and insert -- a non-volatile --, therefor.

In column 6, line 53, in Claim 9, delete "comprising;" and insert -- comprising: --, therefor.

In column 6, line 60, in Claim 9, delete "operation" and insert -- operation, --, therefor.

In column 6, line 63, in Claim 9, after "command" delete "and".

In column 7, line 16, in Claim 11, after "information" insert -- indicating whether the memory device is performing the background operation; --.

In column 8, line 11, in Claim 13, delete "of" and insert -- off --, therefor.

Signed and Sealed this
Fifth Day of November, 2013

Teresa Stanek Rea
*Deputy Director of the United States Patent and Trademark Office*